US012170118B2

(12) United States Patent
Kojima et al.

(10) Patent No.: US 12,170,118 B2
(45) Date of Patent: Dec. 17, 2024

(54) MEMORY SYSTEM

(71) Applicant: Kioxia Corporation, Tokyo (JP)

(72) Inventors: Yoshihisa Kojima, Kawasaki Kanagawa (JP); Shunichi Igahara, Fujisawa Kanagawa (JP); Toshikatsu Hida, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 166 days.

(21) Appl. No.: 18/088,129

(22) Filed: Dec. 23, 2022

(65) Prior Publication Data

US 2023/0367487 A1   Nov. 16, 2023

(30) Foreign Application Priority Data

May 13, 2022   (JP) .................. 2022-079428

(51) Int. Cl.
  *G11C 8/00*   (2006.01)
  *G11C 16/16*   (2006.01)
  *G11C 16/34*   (2006.01)
(52) U.S. Cl.
  CPC .......... *G11C 16/3404* (2013.01); *G11C 16/16* (2013.01); *G11C 8/00* (2013.01)
(58) Field of Classification Search
  CPC ....................................................... G11C 8/02
  See application file for complete search history.

(56) References Cited

U.S. PATENT DOCUMENTS

| 2005/0041515 A1* | 2/2005 | Futatsuyama .... G11C 29/50004 |
| | | 365/232 |
| 2006/0209583 A1 | 9/2006 | Kawabata et al. |
| 2010/0002504 A1 | 1/2010 | Kim et al. |
| 2020/0210309 A1 | 7/2020 | Jung |
| 2020/0411129 A1 | 12/2020 | Vigilante et al. |
| 2021/0011633 A1 | 1/2021 | Kim |

FOREIGN PATENT DOCUMENTS

| TW | 201346912 A | 11/2013 |
| TW | 201346914 A | 11/2013 |

* cited by examiner

*Primary Examiner* — Jason Lappas
(74) *Attorney, Agent, or Firm* — Maier & Maier, PLLC

(57) ABSTRACT

According to one embodiment, a memory system includes a non-volatile memory and a memory controller. The non-volatile memory includes a first block that includes first and second sub-blocks. The memory controller instructs the non-volatile memory to execute a data erase process in units of sub-blocks on data stored in the non-volatile memory. In response to a first value corresponding to the first sub-block having reached a first threshold value, the memory controller reads first data from the first sub-block, executes an error correction process on the first data read from the first sub-block, and writes the first data on which the error correction process has been executed into the non-volatile memory.

20 Claims, 9 Drawing Sheets

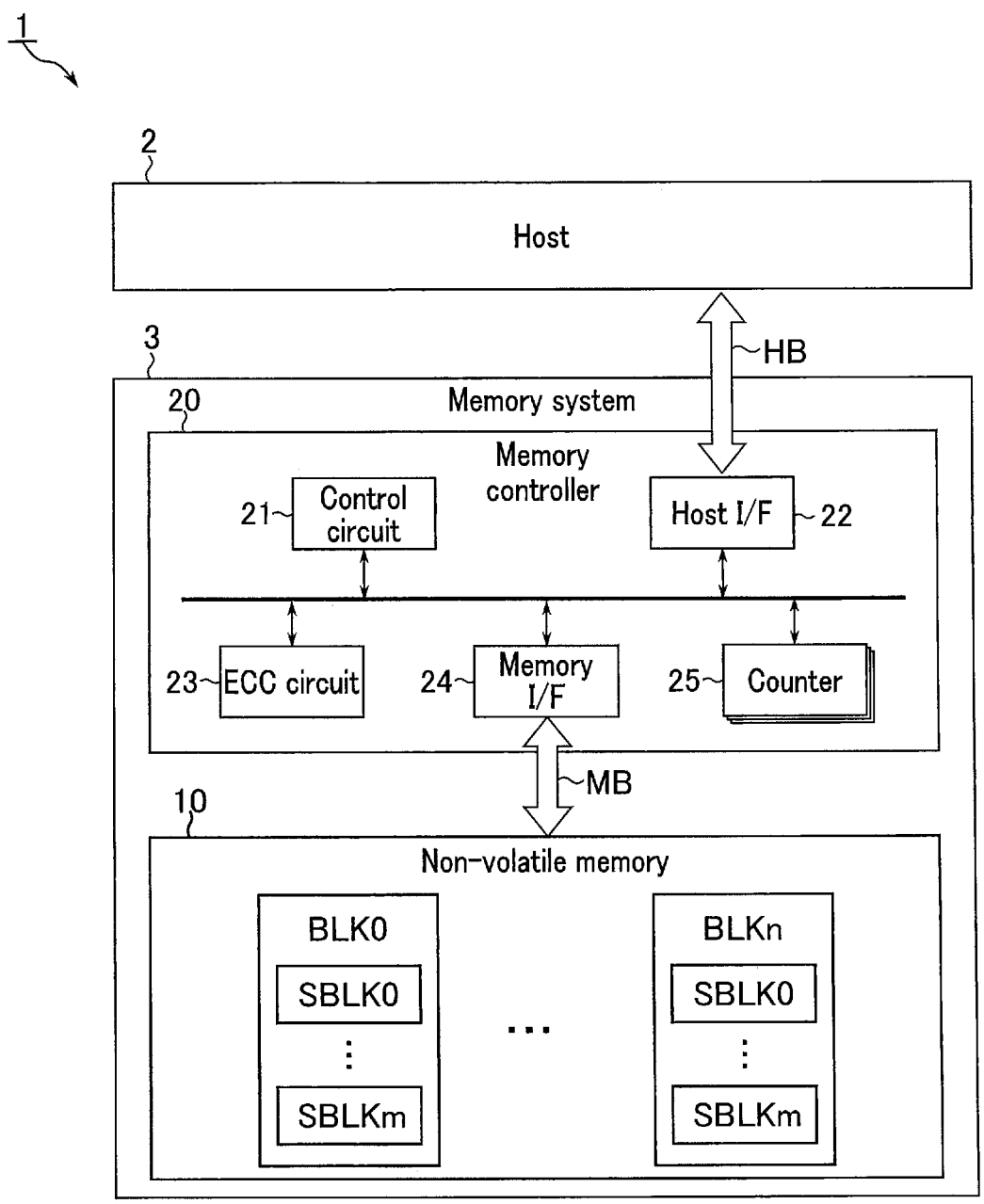
F I G. 1

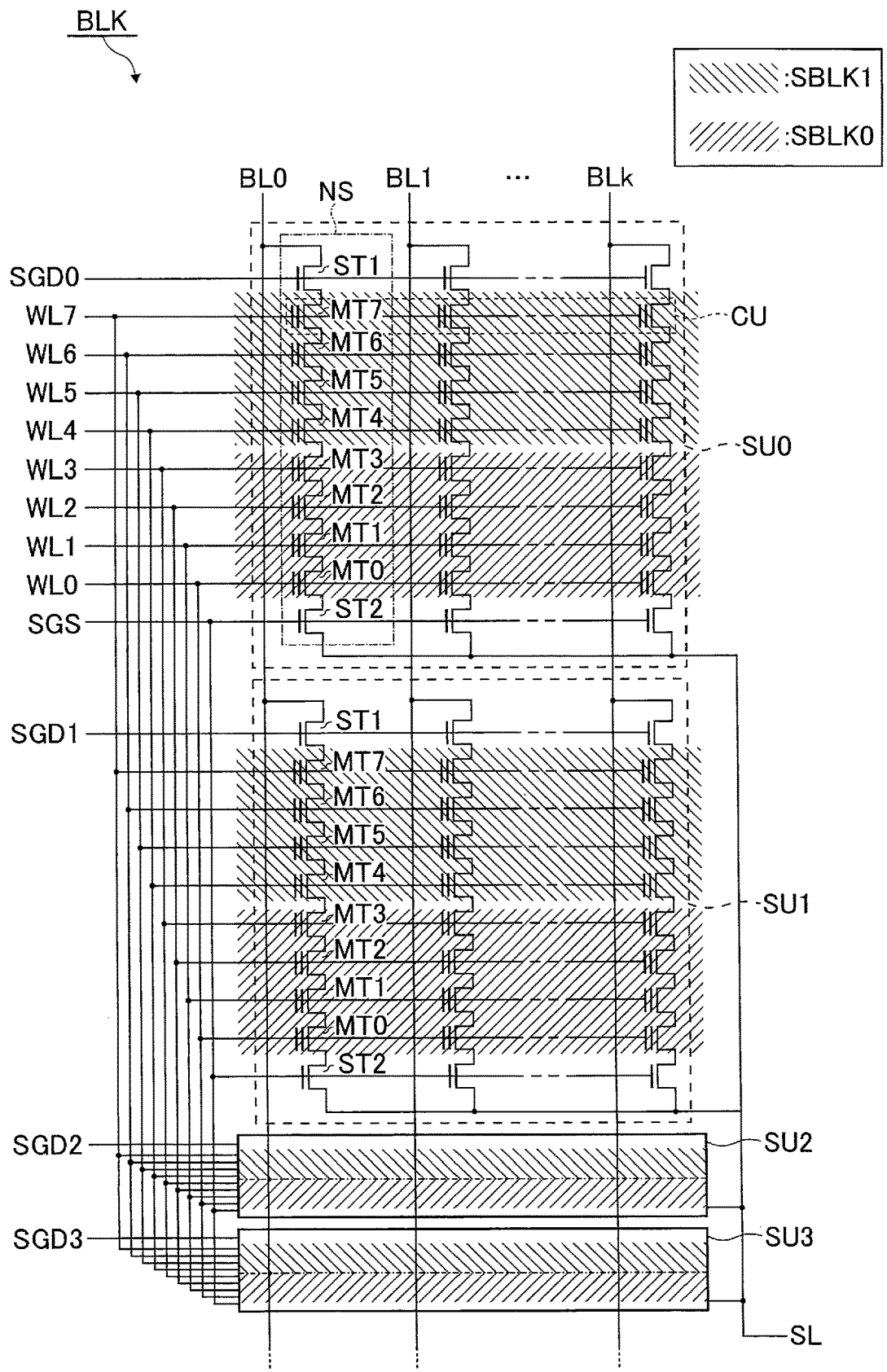
F I G. 4

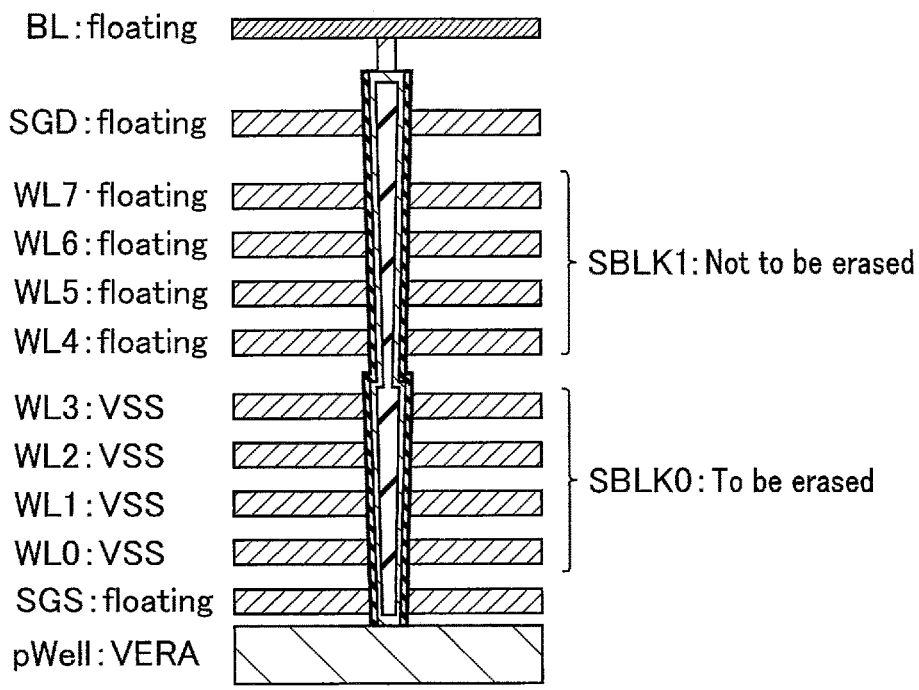
F I G. 8
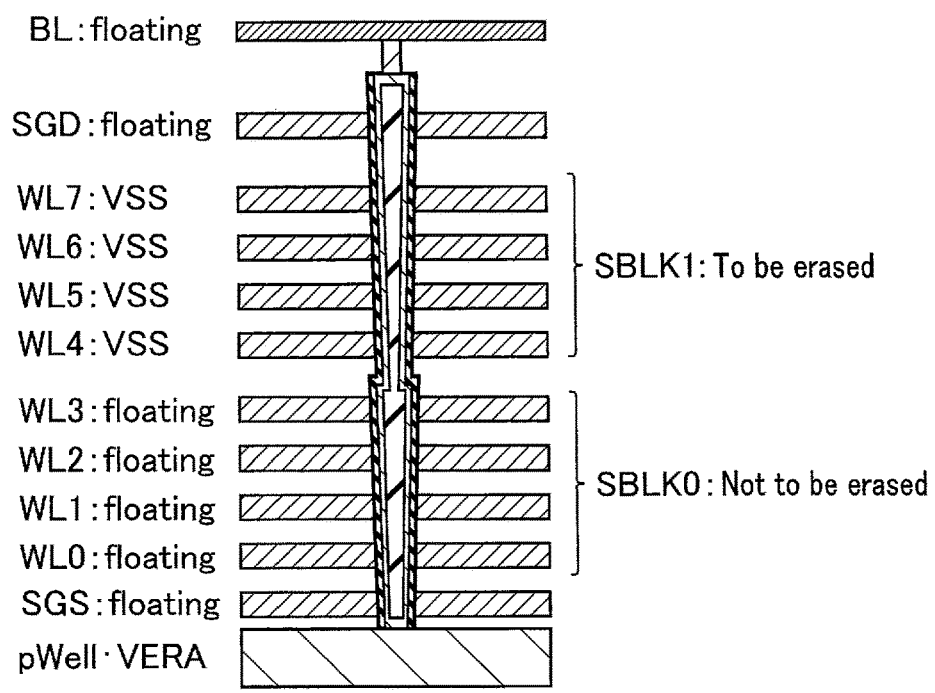
F I G. 9

MEMORY SYSTEM

CROSS-REFERENCE TO RELATED APPLICATIONS

This application is based upon and claims the benefit of priority from Japanese Patent Application No. 2022-079428, filed May 13, 2022, the entire contents of which are incorporated herein by reference.

FIELD

Embodiments described herein relate generally to a memory system.

BACKGROUND

A memory system including a non-volatile memory such as a NAND flash memory and a memory controller that controls the non-volatile memory is known. The memory controller writes data into the non-volatile memory in response to a request from a host.

BRIEF DESCRIPTION OF THE DRAWINGS

FIG. 1 is a block diagram illustrating an example of a configuration of an information processing system according to a first embodiment.

FIG. 4 is a circuit diagram illustrating an example of a circuit configuration of the non-volatile memory according to the first embodiment.

FIG. 8 is a diagram illustrating a first example of a data erase process in units of sub-blocks in the memory system according to the first embodiment.

FIG. 9 is a diagram illustrating a second example of the data erase process in units of sub-blocks in the memory system according to the first embodiment.

DETAILED DESCRIPTION

Figure 2:
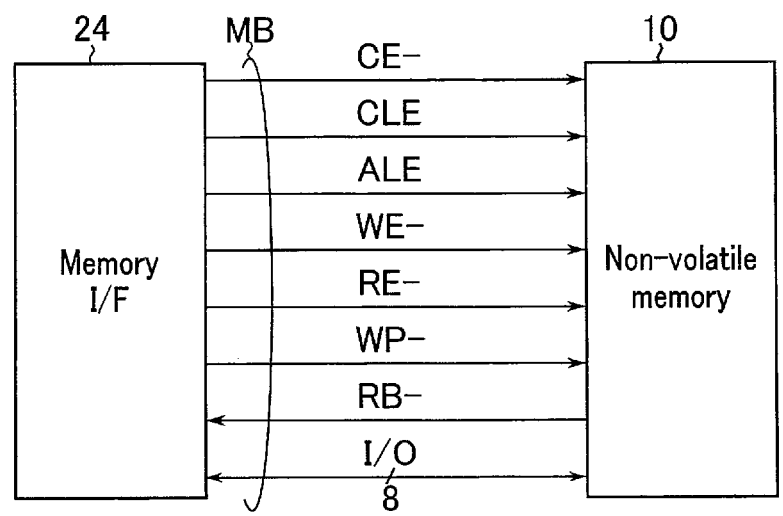
FIG. 2 is a block diagram illustrating an example of signals used in a memory bus according to the first embodiment.

In general, according to one embodiment, a memory system includes a non-volatile memory and a memory controller. The non-volatile memory includes a first block including a plurality of memory cells. The first block includes a first sub-block and a second sub-block. The first sub-block includes a first memory cell. The second sub-block includes a second memory cell. The second memory cell is coupled in series to the first memory cell or coupled in parallel to the first memory cell with respect to a single bit line. The memory controller is configured to instruct the non-volatile memory to execute a data erase process in units of sub-blocks on data stored in the non-volatile memory. The memory controller is further configured to: in response to a first value corresponding to the first sub-block having reached a first threshold value, read first data from the first sub-block; execute an error correction process on the first data read from the first sub-block; and write the first data on which the error correction process has been executed into the non-volatile memory.

Hereinafter, embodiments will be described with reference to the accompanying drawings. In the following description, components having an identical function and configuration will be assigned a common reference numeral.

1. First Embodiment

1. 1 Configuration

1. 1. 1 Information Processing System

A configuration of an information processing system according to a first embodiment will be described.

FIG. 1 is a block diagram illustrating a configuration of an information processing system according to a first embodiment. As illustrated in FIG. 1, an information processing system 1 includes a host 2 and a memory system 3.

The host 2 is a data processing apparatus that processes data using the memory system 3. The host 2 is, for example, a personal computer or a server in a data center.

The memory system 3 is a storage device configured to be coupled to the host 2. The memory system 3 is, for example, a memory card such as an SD™ card, a Universal Flash Storage (UFS), or a solid-state drive (SSD). The memory system 3 executes a data write process, a data read process, and a data erase process of data in response to a request from the host 2. The memory system 3 may execute a data write process, a data read process, and a data erase process as internal processing.

1. 1. 2 Memory System

An internal configuration of the memory system 3 according to the first embodiment will be described.

The memory system 3 includes a non-volatile memory 10 and a memory controller 20.

The non-volatile memory 10 is, for example, a NAND flash memory. The non-volatile memory 10 includes a plurality of blocks BLK (BLK0 to BLKn). Each block BLK includes a plurality of sub-blocks SBLK (SBLK0 to SBLKm). Here, m and n are integers equal to or greater than 1. Each sub-block SBLK includes a plurality of memory cells. Each memory cell stores data in a non-volatile manner. The block BLK and the sub-block SBLK are, for example, units of a data erase process. Hereinafter, a data erase process in which data is erased in units of blocks BLK will also be referred to as a "data erase process in units of blocks". A data erase process in which data is erased in units of sub-blocks SBLK will be referred to as a "data erase process in units of sub-blocks". Hereinafter, a case will be described where, for convenience in explanation, two sub-blocks SBLK0 and SBLK1 are included (i.e., m=1) in a single block BLK.

The memory controller 20 is configured of an integrated circuit such as a system-on-a-chip (SoC). The memory controller 20 controls the non-volatile memory 10, for example, based on a request from the host 2. Specifically, the memory controller 20 instructs the non-volatile memory 10 to execute a data write process, a data read process, and a data erase process.

Specifically, for example, the memory controller 20 writes write data into the non-volatile memory 10 based on a write request from the host 2. Also, the memory controller 20 reads read data from the non-volatile memory 10 based on a read request from the host 2. The memory controller 20 transmits data based on the read data to the host 2.

1. 1. 3 Memory Controller

Next, an internal configuration of the memory controller 20 will be described with reference to FIG. 1. The memory controller 20 includes a control circuit 21, a host interface circuit (host I/F) 22, an error check and correction (ECC) circuit 23, a memory interface circuit (memory I/F) 24, and a plurality of counters 25. The functions of the components 21-25 of the memory controller 20 to be described below may be implemented either as dedicated hardware, a processor that executes programs, or a combination thereof.

The control circuit 21 is a circuit that controls the entirety of the memory controller 20. The control circuit 21 includes, for example, a processor such as a central processing unit (CPU), a read-only memory (ROM), and a random access memory (RAM).

The host interface circuit 22 takes control of communications between the memory controller 20 and the host 2. The host interface circuit 22 is coupled to the host 2 via a host bus HB. The host bus (HB) is compatible with, for example, an SD™ interface, a Serial Attached SCSI (Small Computer System Interface) (SAS), a Serial ATA (Advanced Technology Attachment) (SATA), or a PCI (Peripheral Component Interconnect) Express (PCIe™).

The ECC circuit 23 performs an error detection process and an error correction process on data stored in the non-volatile memory 10. That is, in a data write process, the ECC circuit 23 appends an error correction code to write data. In a data read process, the ECC circuit 23 decodes read data, and determines whether or not a failed bit exists. A failed bit is, a bit of data (including one or more bits) read from a memory cell differently from the data written into the memory cell. If a failed bit is detected, the ECC circuit 23 specifies the location of the failed bit and performs the error correction process.

The memory interface circuit 24 takes control of communications between the non-volatile memory 10 and the memory controller 20. The memory interface circuit 24 is coupled to the non-volatile memory 10 via a memory bus MB. The memory bus MB is, for example, compatible with a single-data-rate (SDR) interface, a toggle double-data-rate (DDR) interface, or an Open NAND Flash Interface (ONFI).

Each of the counters 25 includes, for example, a register. The number of the counters 25 corresponds to, for example, the number of sub-blocks SBLK in the non-volatile memory 10. Each counter 25 stores a count value in response to an instruction from the control circuit 21. Each counter 25 may be an up-counter. In the case of an up-counter, each counter 25 counts up (increments) the count value in response to an instruction from the control circuit 21. Each counter 25 may be a down-counter. In the case of a down-counter, each counter 25 counts down (decrements) the count value in response to an instruction from the control circuit 21. Each counter 25 resets the count value to an initial value in response to an instruction from the control circuit 21. The initial value may be set to any given value. Specifically, if the counter 25 is an up-counter, the initial value may be set to 0. If the counter 25 is a down-counter, the initial value may be set to a positive value.

1. 1. 4 Memory Bus

Next, an example of signals exchanged between the non-volatile memory 10 and the memory controller 20 will be described. FIG. 2 is a block diagram illustrating an example of signals used in the memory bus MB according to the first embodiment.

Signals used in the memory bus MB include, for example, a chip enable signal CE-, a command latch enable signal CLE, an address latch enable signal ALE, a write enable signal WE-, a read enable signal RE-, a write protect signal WP-, a ready/busy signal RB-, and an input/output signal I/O. Herein, "-" at the end of the name of a signal means that the signal is asserted in a "Low (L)" level.

The chip enable signal CE- is a signal for enabling the non-volatile memory 10.

The command latch enable signal CLE and the address latch enable signal ALE are signals that notify the non-volatile memory 10 that an input signal I/O to the non-volatile memory 10 is a command and an address, respectively.

The write enable signal WE- is a signal for allowing the non-volatile memory 10 to acquire the input signal I/O.

The read enable signal RE- is a signal for reading an output signal I/O from the non-volatile memory 10.

The write protect signal WP- is a signal for instructing the non-volatile memory 10 to prohibit writing and erasing of data.

The ready/busy signal RB- is a signal indicating whether the non-volatile memory 10 is in a ready state or a busy state. The ready state is a state in which the non-volatile memory 10 is capable of receiving a command from the memory controller 20. The busy state is a state in which the non-volatile memory 10 cannot receive a command from the memory controller 20. The "L" level of the ready/busy signal RB- indicates a busy state.

The input/output signal I/O is, for example, an 8-bit signal. The input/output signal I/O is an entity of data transmitted and received between the non-volatile memory 10 and the memory controller 20. The input/output signal I/O includes a command, an address, and data such as write data and read data.

1. 1. 5 Non-Volatile Memory

Next, a configuration of the non-volatile memory 10 will be described.

1. 1. 5. 1 Memory Configuration

Figure 3:
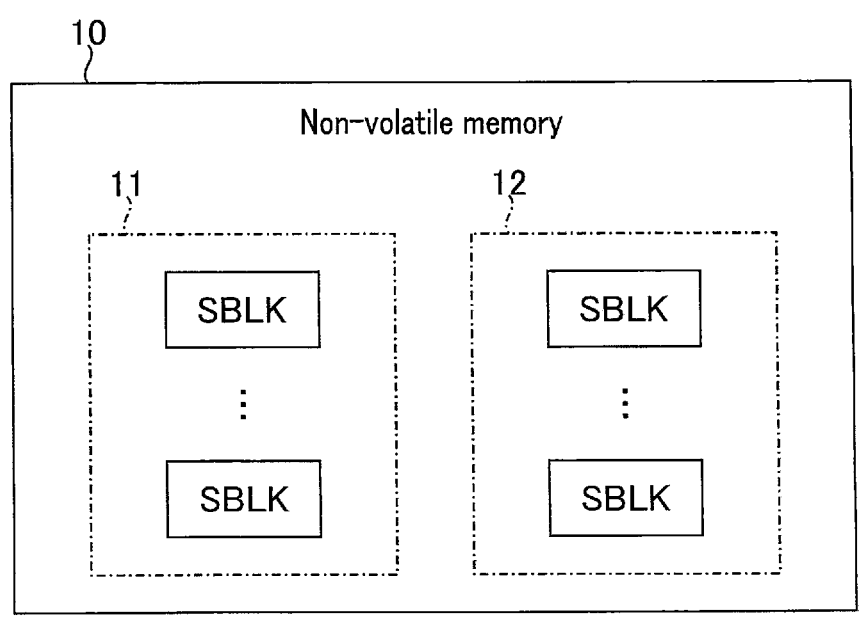
FIG. 3 is a block diagram illustrating an example of a memory configuration of a non-volatile memory according to the first embodiment.

FIG. 3 is a block diagram illustrating an example of a memory configuration of a non-volatile memory according to the first embodiment. The non-volatile memory 10 includes, for example, a system region 11 and a user region 12.

The system region 11 is a memory region to which an access from the host 2 is inhibited. The system region 11 includes a plurality of sub-blocks SBLK. Specifically, for example, the system region 11 includes a first number of sub-blocks SBLK and a second number of sub-blocks SBLK. The first number is in proportion to a memory capacity of the non-volatile memory 10. The second number is a predetermined number regardless of the memory capacity of the non-volatile memory 10. Examples of the first number of sub-blocks SBLK include sub-blocks SBLK for storing a look-up table (LUT) indicating a correspondence between a logical address and a physical address. Examples of the second number of sub-blocks SBLK include a sub-block SBLK for storing firmware, a sub-block SBLK for storing management data, a sub-block SBLK for evacuating data in the memory controller 20 in the case of a power loss, and a sub-block SBLK used as a write destination for newly writing the LUT.

The user region 12 is a memory region for storing write data from the host 2. The user region 12 includes a plurality of sub-blocks SBLK. The user region 12 may include a sub-block SBLK for overprovisioning. Of the sub-blocks SBLK in the non-volatile memory 10, for example, all the sub-blocks SBLK excluding the sub-block SBLK assigned to the system region 11 may be assigned to the user region 12. Valid data, for example, is stored in the sub-block SBLK in the user region 12. Note that the user region 12 includes a third number of sub-blocks SBLK and a fourth number of sub-blocks SBLK. The third number is in proportion to the memory capacity of the non-volatile memory 10. The fourth number is a predetermined number assigned regardless of the memory capacity of the non-volatile memory 10. Examples of the fourth number of sub-blocks SBLK include a free block BLK pooled for stabilizing a performance, an erased block BLK, and a block BLK used as a write destination for newly writing the write data.

Note that each of the sub-blocks SBLK is dynamically assigned to the system region 11 and the user region 12. That is, a sub-block SBLK assigned to the system region 11 may be re-assigned to the user region 12. A sub-block SBLK assigned to the user region 12 may be re-assigned to the system region 11.

1. 1. 5. 2 Circuit Configuration

FIG. 4 is a circuit diagram illustrating an example of a circuit configuration of a non-volatile memory according to the first embodiment. In FIG. 4, a configuration of a single block BLK is illustrated as an example. Each block BLK includes, for example, four string units SU0 to SU3. Note that the configuration of the string units SU2 and SU3 is simplified in FIG. 4.

Each string unit SU includes a plurality of NAND strings NS respectively associated with bit lines BL0 to BLk (where k is an integer equal to or greater than 1). Each NAND string NS includes, for example, memory cell transistors MT0 to MT7 and select transistors ST1 and ST2.

The memory cell transistor MT is a transistor including a charge storage layer. The memory cell transistor MT stores data in a non-volatile manner according to an amount of charge stored in the charge storage layer. Each of the select transistors ST1 and ST2 is used for selection of a string unit SU in various processes.

In each NAND string NS, the memory cell transistors MT0 to MT7 are coupled in series. A select transistor ST1 is coupled between one end of the group of the memory cell transistors MT0 to MT7 coupled in series and a bit line BL associated therewith. A drain of a select transistor ST2 is coupled to the other end of the group of the memory cell transistors MT0 to MT7 coupled in series. A source line SL is coupled to a source of the select transistor ST2.

In a single block BLK, gates of select transistors ST1 in the string units SU0 to SU3 are commonly coupled to select gate lines SGD0 to SGD3, respectively. Control gates of the memory cell transistors MT0 to MT7 are commonly coupled to the word lines WL0 to WL7, respectively. Gates of the select transistors ST2 are commonly coupled to a select gate line SGS.

The bit lines BL0 to BLk are shared among a plurality of blocks BLK0 to BLKn. The same bit line BL is coupled to the NAND strings NS corresponding to the same column address. The word lines WL0 to WL7 are provided in each of the blocks BLK0 to BLKn. The source line SL is, for example, shared among a plurality of blocks BLK.

A set of memory cell transistors MT coupled to a common word line WL in each string unit SU is also referred to as, for example, a "cell unit CU". A cell unit CU is used as, for example, a unit of a data write process. The storage capacity of a cell unit CU that includes a plurality of memory cell transistors MT each storing 1-bit data is defined as, for example, "1-page data". That is, 1-page data stores data sequence that includes the same number of 1-bit data pieces as the number of memory cell transistors MT in a cell unit CU. The 1-page data is used as, for example, a unit of a data read process. The cell unit CU may have a storage capacity of two or more pages of data according to the number of bits of data stored in the memory cell transistors MT. A data write process is classified into a plurality of write modes according to the number bits of data to be written into the memory cell transistor MT. For example, a write mode in which 1-bit data is written is also referred to as a "single-level cell (SLC) mode". A write mode in which 2-bit data is written is also referred to as a "multi-level cell (MLC) mode". A write mode in which 3-bit data is written is also referred to as a "triple-level cell (TLC) mode". A write mode in which 4-bit data is written is also referred to as a "quadruple-level cell (QLC) mode".

In a block BLK with the above-described circuit configuration, a plurality of memory cell transistors MT are respectively assigned to the sub-blocks SBLK0 to SBLKm. Specifically, of the memory cell transistors MT0 to MT7 included in a single NAND string NS, all the memory cell transistors MT included in a sub-block SBLK are coupled in series, without any memory cell transistors included in another sub-block SBLK intervening.

In the example of FIG. 4, a case is illustrated where a plurality of memory cell transistors MT in a block BLK are included in the sub-block SBLK0 or SBLK1. In this case, memory cell transistors MT respectively coupled to the word lines WL0 to WL3 are included in the sub-block SBLK0. Memory cell transistors MT respectively coupled to the word lines WL4 to WL7 are included in the sub-block SBLK1. In other words, memory strings each including the memory cell transistors MT0 to MT3 of the NAND strings NS are included in the sub-block SBLK0. Of the NAND strings NS, memory strings each including the memory cell transistors MT4 to MT7 are included in the sub-block SBLK1.

Note that the circuit configuration of the block BLK described above is merely an example, and is not limited thereto. For example, the number of blocks BLK included in the non-volatile memory 10 may be designed to be any given number. The number of sub-blocks SBLK included in each block BLK may be designed to be any given number. The number of string units SU included in each block BLK may be designed to be any given number. The number of memory cell transistors MT and the number of select transistors ST1 and ST2 included in each NAND string NS may be designed to be any given number.

1. 1. 5. 3 Planar Layout

Hereinafter, an example of a structure of a block BLK included in the non-volatile memory 10 will be described. Note that, in the drawings to be referred to below, an X-direction corresponds to a direction in which the word lines WL extend. A Y-direction corresponds to a direction in which the bit lines BL extend. A Z-direction corresponds to a vertical direction relative to a surface of a semiconductor substrate used for forming a block BLK.

In planar views, hatching is suitably applied for improved visibility. The hatching applied in the planar views does not necessarily relate to the material or characteristics of the hatched components. In cross-sectional views, configurations are suitably omitted for improved visibility.

Figure 5:
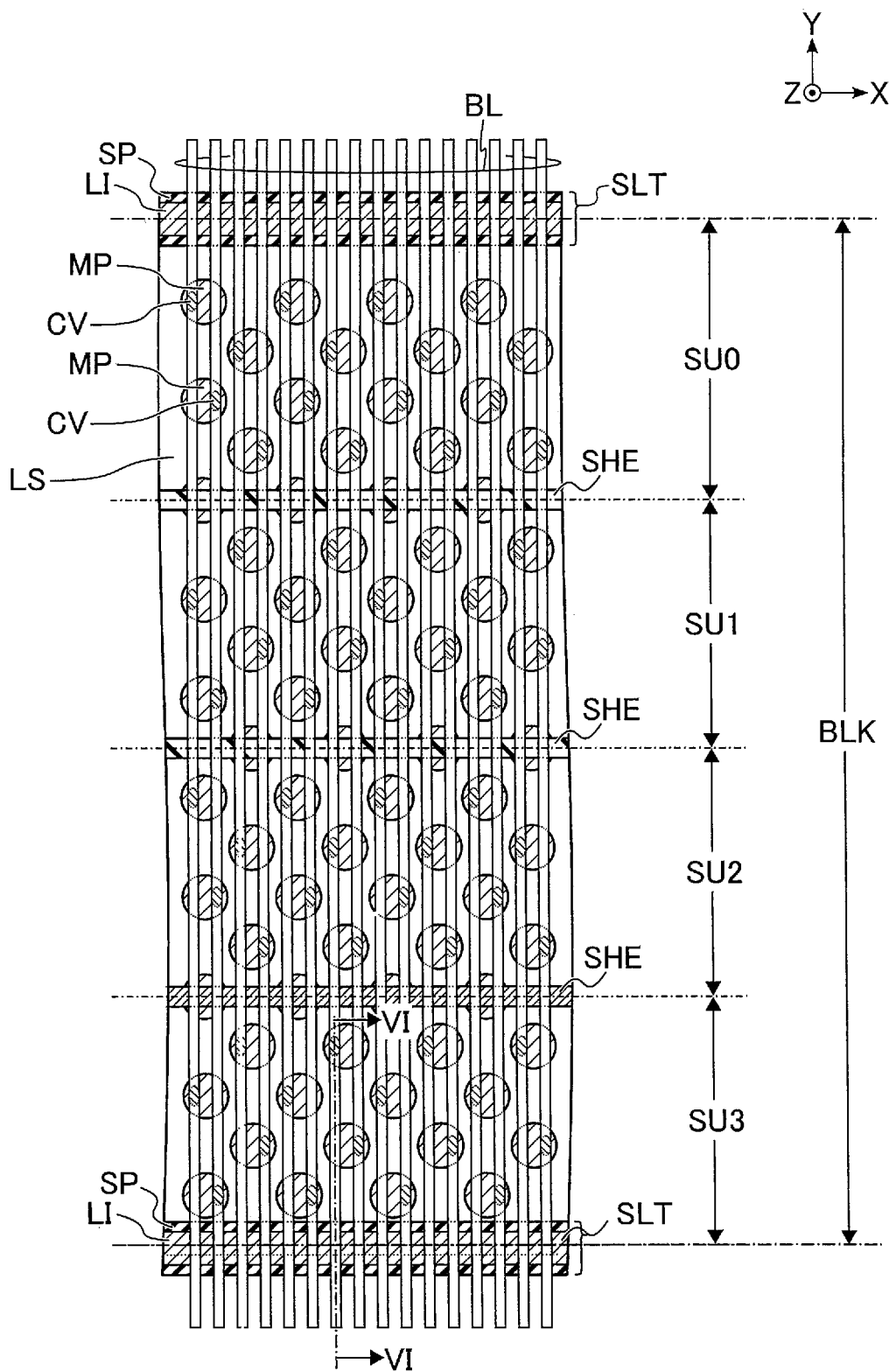
FIG. 5 is a planar view illustrating an example of a planar layout of a block included in the non-volatile memory according to the first embodiment.

FIG. 5 is a planar view illustrating an example of a planar layout of a block included in a non-volatile memory according to the first embodiment. In FIG. 5, a portion of a single block BLK (i.e., string units SU0 to SU3) and a plurality of bit lines BL, two members SLT, and three members SHE, each corresponding to the portion of the single block BLK are illustrated.

Each member SLT is, for example, a plate-shaped member extending in the XZ-plane. Each member SLT includes a contact LI and a spacer SP. The contact LI is a plate-shaped conductor extending in the XZ-plane. The spacer SP is an insulator provided on a Y-direction side surface of the contact LI. The contact LI is surrounded by a spacer SP as viewed in the Z-direction. Two members SLT are aligned in the Y-direction sandwiching a single block BLK.

Each member SHE is, for example, a plate-shaped insulator extending in the XZ-plane. Three members SHE are aligned in the Y-direction between the two members SLT.

The block BLK includes a stacked interconnect LS, a plurality of memory pillars MP, and a plurality of contacts CV.

The stacked interconnect LS has a stacked structure including a plurality of conductive layers distanced from each other in the Z-direction. The conductive layers included in the stacked interconnect LS respectively function as, for example, the source line SL, the word lines WL, and the select gate lines SGD and SGS. Of the plurality of conductive layers included in the stacked interconnect LS, a conductive layer which functions as a word line WL or select gate lines SGD and SGS is split by each member SLT. Of the plurality of conductive layers included in the stacked interconnect LS, a conductive layer which functions as a select gate line SGD is split by each member SHE.

Each memory pillar MP has a pillar-shaped structure surrounded by the stacked interconnect LS as viewed in the Z-direction. Each memory pillar MP functions as, for example, a single NAND string NS. The memory pillars MP are arranged, for example, in a 19-row staggered manner in a region between adjacent members SLT. For example, a single member SHE overlaps a memory pillar MP in the 5th row, a memory pillar MP in the 10th row, and a memory pillar MP in the 15th row, counting from an upper side of the drawing.

The bit lines BL, each extending in the Y-direction, are aligned in the X-direction. Each bit line BL is arranged so as to overlap at least one memory pillar MP in each string unit SU. In the example of FIG. 5, a case is illustrated where two bit lines BL are arranged so as to overlap a single memory pillar MP in each string unit SU. Of the plurality of bit lines BL overlapping memory pillars MP, a single bit line BL and a corresponding single memory pillar MP are electrically coupled via a contact CV.

A contact CV between a bit line BL and a memory pillar MP that is in contact with the member SHE, for example, is omitted. In other words, a contact CV between a bit line BL and a memory pillar MP that is in contact with two different select gate lines SGD is omitted.

A planar layout described above is repeatedly arranged in the Y-direction. Each of the regions partitioned by the member SLT corresponds to a single block BLK. Each of the regions partitioned by the member SLT or SHE corresponds to a single string unit SU.

Note that the number and arrangement of the memory pillars MP, the members SHE, etc. between adjacent members SLT are not limited to the configuration described with reference to FIG. 5, and may be suitably varied. The number of bit lines BL that overlap each memory pillar MP may be designed to be any given number.

1. 1. 5. 4 Cross-Sectional Structure

Figure 6:
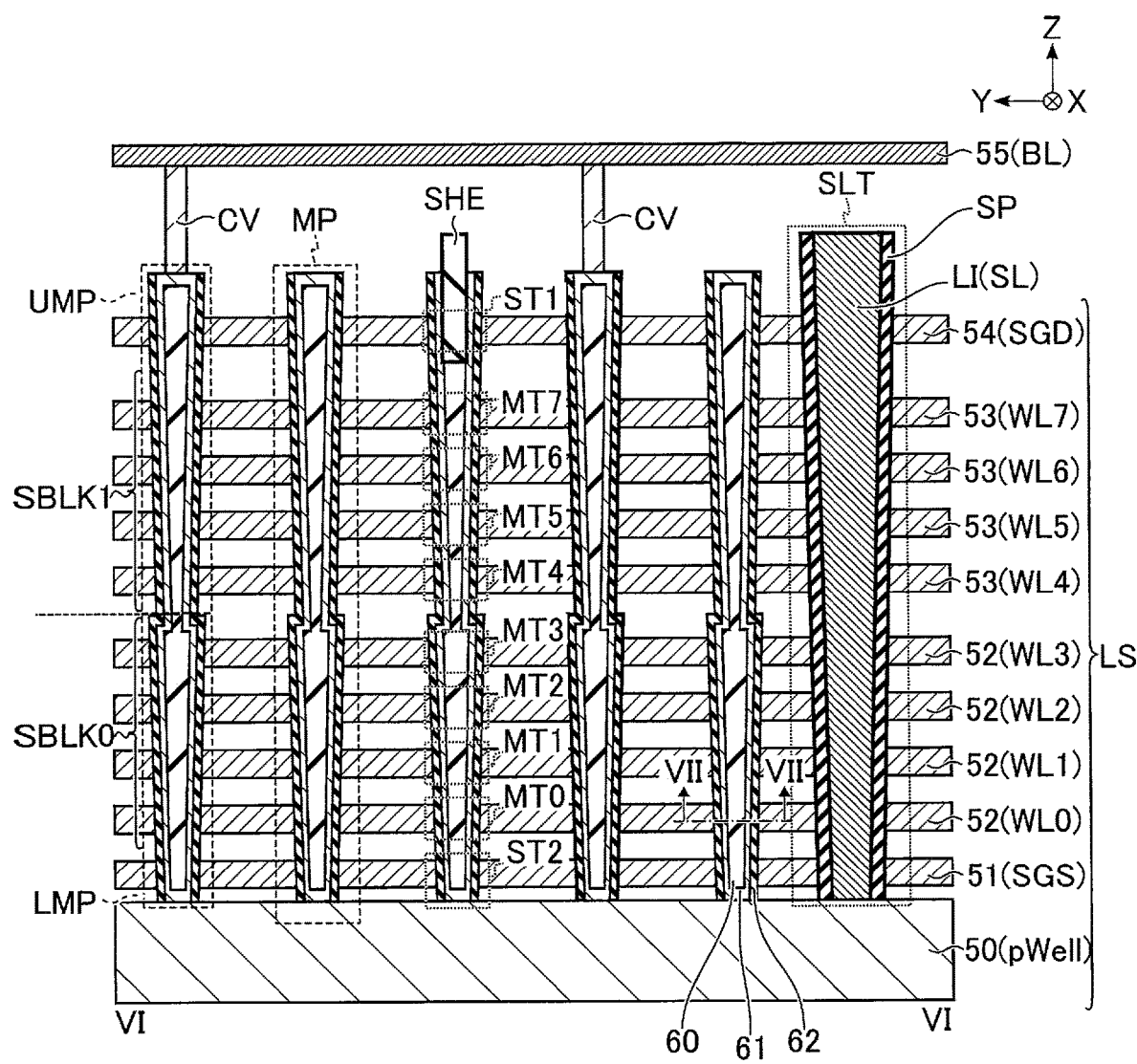
FIG. 6 is a cross-sectional view taken along line VI-VI of FIG. 5, illustrating an example of a cross-sectional structure of a block included in the non-volatile memory according to the first embodiment.

FIG. 6 is a cross-sectional view taken along line VI-VI of FIG. 5, illustrating an example of a cross-sectional structure of a block included in a non-volatile memory according to the first embodiment. As shown in FIG. 6, the block BLK further includes conductive layers 50 to 55.

The conductive layer 50 is, for example, a plate-shaped conductor extending in the XY-plane. The conductive layer 50 is used as a p-type well region. The conductive layer 50 contains, for example, silicon doped with phosphorous.

A conductive layer 51 is provided via an insulating layer (unillustrated) on the upper surface of the conductive layer 50. The conductive layer 51 is, for example, a plate-shaped conductor extending in the XY-plane. The conductive layer 51 is used as a select gate line SGS. The conductive layer 51 contains, for example, tungsten.

A plurality of insulating layers (unillustrated) and a plurality of conductive layers 52 are stacked in an alternating manner on the upper surface of the conductive layer 51. The conductive layers 52 are, for example, plate-shaped conductors extending in the XY-plane. The stacked conductive layers 52 are respectively used as word lines WL0 to WL3, from the side of the conductive layer 51. The conductive layers 52 contain, for example, tungsten.

A plurality of insulating layers (unillustrated) and a plurality of conductive layers 53 are stacked in an alternating manner on the upper surface of the topmost one of the conductive layers 52 (topmost conductive layer 52). The conductive layers 53 are, for example, plate-shaped conductors extending in the XY-plane. The stacked conductive layers 53 are respectively used as word lines WL4 to WL7, from the side of the conductive layer 52. The conductive layers 53 contain, for example, tungsten.

A conductive layer 54 is provided via an insulating layer (unillustrated) on the upper surface of the topmost one of the conductive layers 53 (topmost conductive layer 53). The conductive layer 54 is, for example, plate-shaped conductor extending in the XY-plane. The conductive layer 54 is used as a select gate line SGD. The conductive layer 54 contains, for example, tungsten.

A plurality of conductive layers 55 are provided via an insulating layer (unillustrated) on the upper surface of the conductive layer 54. The conductive layers 65 are arrayed along the X-direction in an unillustrated region. The conductive layers 55 are, for example, line-shaped conductors extending in the Y-direction. The conductive layers 55 are used as bit lines BL. The conductive layers 55 contain, for example, copper.

A plurality of memory pillars MP are provided so as to penetrate the conductive layers 51 to 54. Each memory pillar MP extends in the Z-direction. The bottom portion of each memory pillar MP reaches the conductive layer 50. The portion at which the memory pillar MP and the conductive layer 51 intersect functions as a select transistor ST2. The portion at which the memory pillar MP and each conductive layer 52 or 53 intersect functions as a single memory cell transistor MT. The portion at which the memory pillar MP and the conductive layer 54 intersect functions as a select transistor ST1.

Each memory pillar MP includes, for example, a core film 60, a semiconductor film 61, and a laminated film 62. The core film 60 extends in the Z-direction. The upper end of the core film 60 is positioned, for example, at a layer above the conductive layer 54. The lower end of the core film 60 is positioned at a layer below the conductive layer 51. The semiconductor film 61 surrounds a periphery of the core film 60. A portion of the semiconductor film 61 is in contact with the conductive layer 50. The laminated film 62 covers the side surface and the bottom surface of the semiconductor film 61, except for a portion at which the semiconductor film 61 and the conductive layer 50 are in contact with each other. The core film 60 contains, for example, an insulator such as silicon oxide. The semiconductor film 61 contains, for example, silicon.

Each memory pillar MP includes an upper part UMP and a lower part LMP. The lower end of the upper part UMP and the upper end of the lower part IMP are positioned between the topmost one of the conductive layers 52 and the bottommost one of the conductive layers 53 (bottommost conductive layer 53). The semiconductor film 61 is in contact with the lower end of the upper part UMP and the upper end of the lower part IMP in a continuous manner. The side surface of the lower part IMP is not aligned with (i.e., is shifted from) an extension of the side surface of the upper part UMP. Such a shift between the side surface of the lower part IMP and the extension of the side surface of the upper part UMP occurs not only in the YZ-cross section shown in FIG. 6, but in any cross section, including the Z-direction. A portion of the lower part LMP including the conductive layers 52 corresponds to the sub-block SBLK0. A portion of the upper part UMP including the conductive layers 53 corresponds to a sub-block SBLK1.

A pillar-shaped contact CV is provided on the upper surface of the semiconductor film 61 in the memory pillar MP. In the illustrated region, in each of the cross-sectional regions partitioned by the members SLT and SHE, a single contact CV corresponding to one of two memory pillars MP is depicted. To a memory pillar MP which does not overlap the member SHE and to which a contact CV is not coupled in the illustrated region, a corresponding contact CV is coupled in an unillustrated region.

One of the plurality of conductive layers 55, namely, a single bit line BL is in contact with the upper surface of the contact CV. In each of the spaces partitioned by the members SLT and SHE, a single conductive layer 55 is in contact with a single contact CV. That is, a memory pillar MP provided between adjacent members SLT and SHE, and a memory pillar MP provided between two adjacent members SHE, are electrically coupled to each of the conductive layers 55.

The member SLT splits the conductive layers 51 to 54. The upper end of the member SLT is positioned above the upper end of the memory pillar MP. The lower end of the contact LI is in contact with the conductive layer 50. The spacer SP is provided between the contact LI and the conductive layers 51 to 54. That is, the contact LI and the conductive layers 51 to 54 are isolated and insulated by the spacer SP. The contact LI may be used as a part of the source line SL.

The member SHE splits the conductive layer 54. The upper end of the member SHE is positioned above the upper end of the memory pillar MP. The lower end of the member SHE is positioned between the conductive layer 54 and the topmost one of the conductive layers 53.

Figure 7:
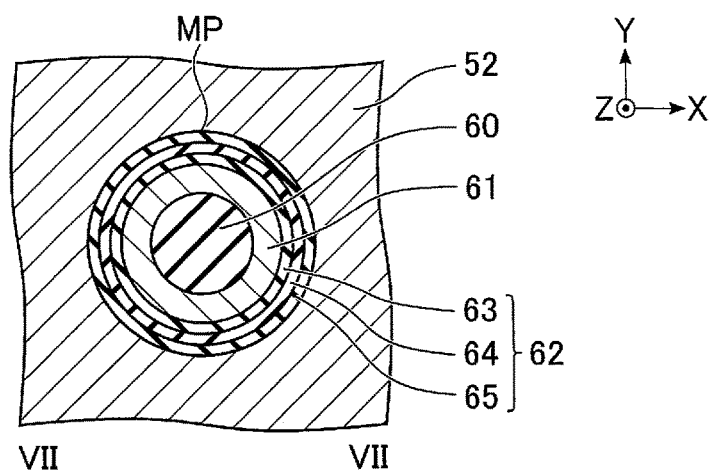
FIG. 7 is a cross-sectional view taken along line VII-VII of FIG. 6, illustrating an example of a cross-sectional structure of a memory pillar included in the non-volatile memory according to the first embodiment.

FIG. 7 is a cross-sectional view taken along line VII-VII of FIG. 6, illustrating an example of a cross-sectional structure of a memory pillar included in the non-volatile memory according to the first embodiment. More specifically, FIG. 7 illustrates a cross-sectional structure of a memory pillar MP and a stacked interconnect LS in a layer including the conductive layer 52.

The laminated film 62 includes, for example, a tunnel insulating film 63, a charge storage film 64, and a block insulating film 65.

In a cross section including the conductive layer 52, the core film 60 is provided at, for example, a central part of the memory pillar MP. The semiconductor film 61 surrounds the side surface of the core film 60. The tunnel insulating film 63 surrounds the side surface of the semiconductor film 61. The charge storage film 64 surrounds the side surface of the tunnel insulating film 63. The block insulating film 65 surrounds the side surface of the charge storage film 64. The conductive layer 52 surrounds the side surface of the block insulating film 65.

The semiconductor film 61 is used as a channel (current path) of the memory cell transistors MT0 to MT7 and the select transistors ST1 and ST2. Each of the tunnel insulating film 63 and the block insulating film 65 contains, for example, silicon oxide. The charge storage film 64 has a function of storing charge. The charge storage film 64 contains, for example, silicon nitride. Thereby, each memory pillar MP may function as a single NAND string NS.

1. 2 Operation

Next, an operation in the memory system according to the first embodiment will be described.

1. 2. 1 Data Erase Process in Units of Sub-Blocks

FIG. 8 is a diagram illustrating a first example of a data erase process in units of sub-blocks in the memory system according to the first embodiment. FIG. 9 is a diagram illustrating a second example of the data erase process in units of sub-blocks in the memory system according to the first embodiment. In FIGS. 8 and 9, an example of a voltage applied to a NAND string NS in a data erase process in units of sub-blocks is illustrated. The first example corresponds to a case where data stored in the sub-block SBLK0 is erased while maintaining data stored in the sub-block SBLK1. The second example corresponds to a case where data stored in the sub-block SBLK1 is erased while maintaining data stored in the sub-block SBLK0.

In either of the cases, a voltage VERA is applied to a p-type well region, as illustrated in FIGS. 8 and 9. The voltage VERA is an erase voltage, and is, for example, 20 V. The select gate lines SGS and SGD and the bit lines BL are brought to a floating state.

In the case where the data stored in the sub-block SBLK0 is erased while maintaining the data stored in the sub-block SBLK1, a voltage VSS is applied to the word lines WL0 to WL3. The voltage VSS is a ground voltage, and is, for example, 0 V. Thereby, in the memory cell transistors MT0 to MT3, electron holes are injected into the charge storage film 64 and data is erased. On the other hand, the word lines WL4 to WL7 are brought to a floating state. Thereby, in the memory cell transistors MT4 to MT7, electron holes are not injected and data is maintained.

In the case where the data stored in the sub-block SBLK1 is erased while maintaining the data stored in the sub-block SBLK0, the word lines WL0 to WL3 are brought to a floating state. Thereby, in the memory cell transistors MT0 to MT3, electron holes are not injected and data is maintained. On the other hand, a voltage VSS is applied to the word lines WL4 to WL7. Thereby, in the memory cell transistors MT4 to MT7, electron holes are injected and data is erased.

With the above-described operation, a data erase process in units of sub-blocks is executed.

Hereinafter, a sub-block SBLK to be a target of a data erase process in units of sub-blocks is also referred to as a "target sub-block SBLK". Also, a sub-block SBLK other than the target sub-block SBLK is also referred to as a "non-target sub-block SBLK".

1. 2. 2 Reliability Determination Process

The data erase process in units of sub-blocks on a target sub-block SBLK may cause a failed bit in part of data stored in a non-target sub-block SBLK in a block BLK that includes the target sub-block SBLK. Similarly, a data write process on a target sub-block SBLK may cause a failed bit in data stored in a non-target sub-block SBLK in a block BLK that includes the target sub-block SBLK. An amount of unselected sub-block disturb (USBD), for example, is used as a criterion for estimating the likelihood of occurrence of a failed bit, which occurs through such a data erase process or data write process on a target sub-block SBLK.

The amount of USBD indicates a reliability of data stored in the non-volatile memory 10. The amount of USBD increases as the reliability of data deteriorates. The amount of USBD can be decreased if a failed bit included in data is corrected by an error correction process, etc. The amount of USBD is estimated for each sub-block SBLK. Specifically, for example, the amount of USBD of a sub-block SBLK is estimated according to a count value of the counter 25 corresponding to the sub-block SBLK. The amount of USBD may be the count value itself of the counter 25. The amount of USBD may be managed by the control circuit 21 as a value based on the count value of the counter 25.

Figure 10:
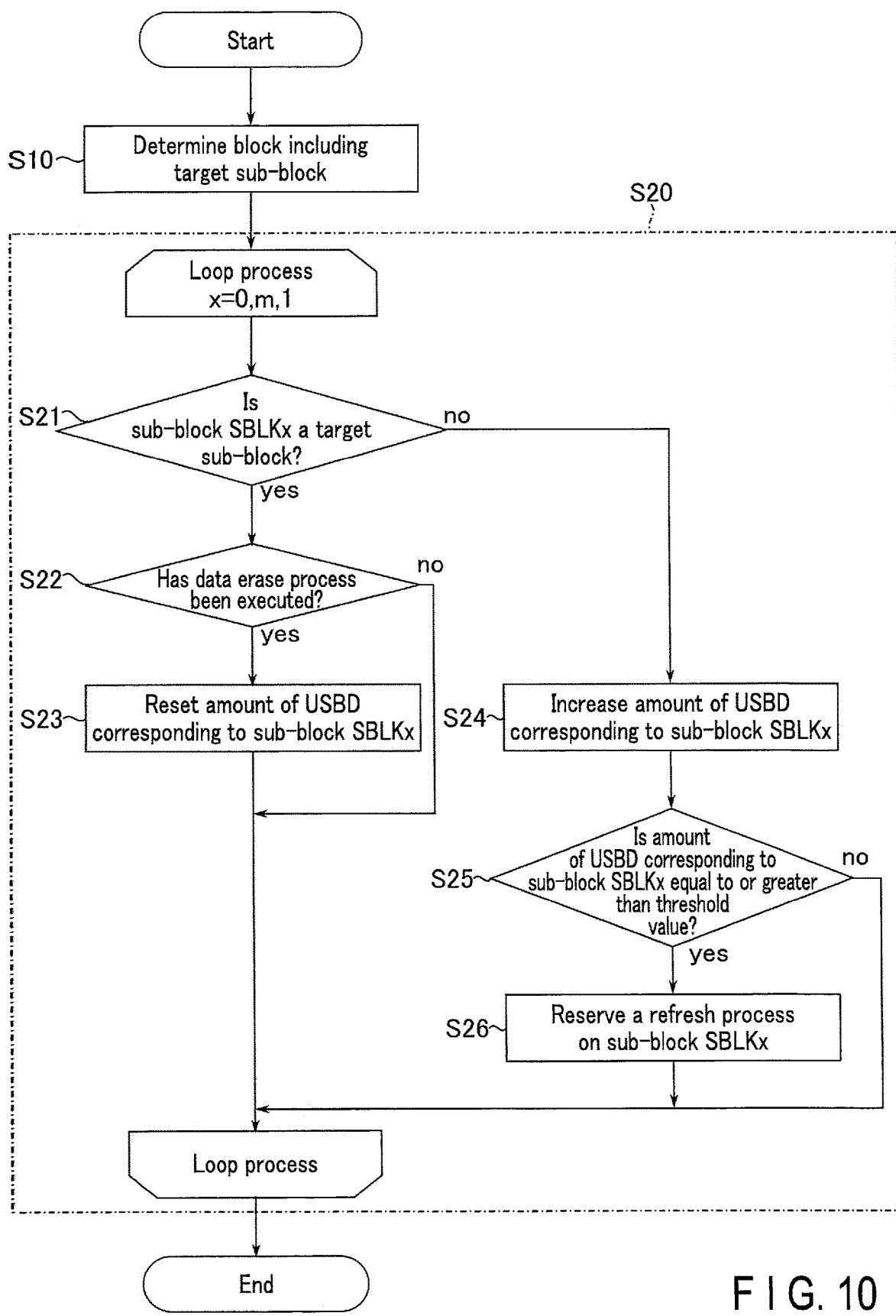
FIG. 10 is a flowchart illustrating an example of a reliability determination process based on an amount of unselected sub-block disturb (USBD) in the memory system according to the first embodiment.

FIG. 10 is a flowchart illustrating an example of a reliability determination process based on the amount of USBD in the memory system according to the first embodiment.

Upon execution of a data erase process or a data write process in units of sub-blocks on a target sub-block SBLK (START), the control circuit 21 determines a block BLK that includes the target sub-block SBLK (S10). Note that the condition for starting step S10 may be execution of a data erase process in units of sub-blocks on a target sub-block SBLK. Alternatively, the condition for starting step S10 may be execution of a data write process in units of sub-blocks on a target sub-block SBLK.

The control circuit 21 executes a loop process based on a variable x on the block BLK determined in the process at step S10 (S20). The variable x is an integer equal to or greater than 0. The loop process at step S20 is started with the variable x being 0. In the loop process at step S20, the variable x is incremented by 1 whenever a repetition unit is executed. The loop process at step S20 ends when the variable x exceeds m. The loop process at step S20 includes steps S21 to S26 as the repetition unit.

The control circuit 21 determines whether or not a sub-block SBLKx in the block BLK determined in the process at step S10 is the target sub-block SBLK (S21).

If the sub-block SBLKx is determined to be the target sub-block SBLK (S21; yes), the control circuit 21 determines, upon starting of the reliability determination process, whether or not the process executed on the target sub-block SBLK is a data erase process (S22).

If the process executed on the target sub-block SBLK upon starting of the reliability determination process is determined to be a data erase process (S22; yes), the control circuit 21 resets the amount of USBD corresponding to the sub-block SBLKx (S23). Specifically, the control circuit 21 resets the count value of the counter 25 corresponding to the sub-block SBLKx to an initial value. If the counter 25 is an up-counter, the control circuit 21 may set the count value of the counter 25 to 0. If the counter 25 is a down-counter, the control circuit 21 may set the count value of the counter 25 to a threshold value Th1.

If the sub-block SBLKx is not determined to be a target sub-block SBLK (S21; no), the control circuit 21 increases the amount of USBD corresponding to the sub-block SBLKx (S24). Specifically, if the counter 25 is an up-counter, the control circuit 21 increments the count value of the counter 25 corresponding to the sub-block SBLKx. If the counter 25 is a down-counter, the control circuit 21 decrements the count value of the counter 25 corresponding to the sub-block SBLKx.

Note that the amount of increasing of the amount of USBD may be changed according to whether or not the process executed on the target sub-block SBLKx upon starting of the reliability determination process is a data erase process or a data write process. Assuming, for example, that the amounts of increasing of the amount of USBD corresponding to the data erase process and the data write process are $\alpha$ and $\beta$, respectively, $\alpha > \beta$ may be satisfied. The magnitude relationship of $\alpha$ and $\beta$ is not limited to the above-described example, and may be $\beta > \alpha$ or $\alpha = \beta$.

The amount of increasing of the amount of USBD corresponding to a data write process may be changed according to the write mode. Assuming, for example, that the amounts of increasing of the amount of USBD in a case where the write mode is an SLC mode, an MLC mode, a TLC mode, and a QLC mode are $\beta\_S$, $\beta\_M$, $\beta\_T$, and $\beta\_Q$, respectively, $\beta\_S < \beta\_M < \beta\_T < \beta\_Q$ may be satisfied. The magnitude relationship of $\beta\_S$, $\beta\_M$, $\beta\_T$, and $\beta\_Q$ is not limited to the above-described example, and may be $\beta\_S > \beta\_M > \beta\_T > \beta\_Q$, or $\beta\_S = \beta\_M = \beta\_T = \beta\_Q$.

After step S24, the control circuit 21 determines whether or not the amount of USBD corresponding to the sub-block SBLKx is equal to or greater than the threshold value Th1 (S25). Note that the threshold value Th1 may be changed according to the write mode applied to the sub-block SBLKx. Assuming, for example, that the threshold values of the amount of USBD in a case where the write mode applied to the sub-block SBLKx is an SLC mode, an MLC mode, a TLC mode, and a QLC mode are Th1\_S, Th1\_M, Th1\_T, and Th1\_Q, respectively, Th1\_S > Th1\_M > Th1\_T > Th1\_Q may be satisfied.

If the amount of USBD corresponding to the sub-block SBLKx is determined to be equal to or greater than the threshold value Th1 (S25; yes), the control circuit 21 determines that the likelihood of occurrence of a failed bit in data stored in the sub-block SBLKx is high. Specifically, the control circuit 21 reserves a refresh process on the sub-block SBLKx (S26).

The refresh process is, for example, a process of recovering data written into the sub-block SBLKx from a failed-bit-included state to a failed-bit-corrected state. As an example of a refresh process, data written into the sub-block SBLKx may be error-corrected by the ECC circuit 23, and then written into the sub-block SBLKx from which the data including the failed bit has been erased. As another example of the refresh process, data written into the sub-block SBLKx may be error-corrected by the ECC circuit 23, and then transcribed into another sub-block SBLK.

Note that, if the counter 25 is an up-counter, the control circuit 21 may determine, in the determination process at step S25, whether or not the amount of USBD is equal to or greater than the threshold value Th1 by determining whether or not the count value of the counter 25 is equal to or greater than the threshold value Th1. If the counter 25 is a down-counter, the control circuit 21 may determine, in the determination process at step S25, whether or not the amount of USBD is equal to or greater than the threshold value Th1 by determining whether or not the count value of the counter 25 has become 0.

If the process executed on the target sub-block SBLKx upon starting of the reliability determination process is not determined to be a data erase process (i.e., is determined to be a data write process) (S22; no), after the processing at step S23, if the amount of USBD corresponding to the selected sub-block SBLKx is determined to be less than the threshold value Th1 (S25; no), or after the processing at step S26, the repetition unit of the loop process at step S20 ends. After incrementing the variable x, the control circuit 21 determines whether or not the variable x has exceeded m. If the variable x is equal to or less than m, the repetition unit of the loop process at step S20 is executed. If the variable x exceeds m, the loop process at step S20 ends.

After the loop process at step S20 ends, the reliability determination process ends (END).

Note that, after the reliability determination process, the memory controller 20 executes a refresh process, for example, at a predetermined timing, on a sub-block SBLK for which the refresh process has been reserved. Such a refresh process may be executed in synchronization with or out of synchronization with the reliability determination process.

1. 3 Effects of First Embodiment

According to the first embodiment, the control circuit 21 reserves a refresh process of a sub-block SBLK if the amount of USBD corresponding to the sub-block SBLK has reached the threshold value Th1. It is thereby possible to recover data written into the sub-block SBLK to a failed-bit-corrected state through a subsequent refresh process. It is thereby possible to suppress deterioration in reliability of the sub-block SBLK.

The control circuit 21 resets an amount of USBD corresponding to a target sub-block SBLK in response to a data erase process on the target sub-block SBLK. Thereby, a decrease in the number of failed bits of the target sub-block SBLK through the data erase process on the target sub-block SBLK can be reflected in the amount of USBD corresponding to the target sub-block SBLK.

The control circuit 21 increases the amount of USBD corresponding to a non-target sub-block SBLK in a block BLK that includes the target sub-block SBLK in response to a data erase process or a data write process on the target sub-block SBLK. Thereby, an increase in the number of failed bits of the non-target sub-block SBLK through the data erase process or the data write process on the target sub-block SBLK can be reflected in the amount of USBD corresponding to the non-target sub-block SBLK.

In the case of the counter 25 being an up-counter, if the count value has reached the threshold value Th1, the control circuit 21 reserves a refresh process on the sub-block SBLK corresponding to the count value. In the case of the counter 25 being a down-counter, if the count value has reached 0, the control circuit 21 reserves a refresh process on the sub-block SBLK corresponding to the count value. Thereby, regardless of whether or not the counter 25 is an up-counter or a down-counter, the amount of USBD can be evaluated based on the count value of the counter 25.

2. Second Embodiment

Next, a memory system according to a second embodiment will be described. The second embodiment differs from the first embodiment in terms of suppression of deterioration in reliability caused by variation in wear among a plurality of sub-blocks SBLK in a single block BLK. Hereinafter, mainly differences from the first embodiment in terms of the configuration and the operation will be described. A description of configurations and operations equivalent to those of the first embodiment will be suitably omitted.

2. 1 Reliability Determination Process

A cycle of a data write process and a data erase process executed on a target sub-block SBLK causes the target sub-block SBLK to wear down. Accumulation of wear may cause a breakdown of the target sub-block SBLK. If the target sub-block SBLK breaks down, there is a possibility that a non-target sub-block SBLK in a block BLK that includes the target sub-block SBLK will not be able to be used together with the broken-down target sub-block SBLK. It is thus desirable, from the viewpoint of suppressing deterioration in reliability of the non-volatile memory 10, to decrease the variation in wear among the sub-blocks SBLK in a single block BLK. An amount of wear, for example, is used as a criterion for estimating a level of accumulation of wear of the target sub-block SBLK caused by a cycle of a data write process and a data erase process on the target sub-block SBLK.

The amount of wear indicates irreversible deterioration of the data retention capacity of the non-volatile memory 10. Accordingly, unlike the amount of USBD, the amount of wear cannot be decreased once it starts to increase. The amount of wear is estimated for each sub-block SBLK. Specifically, for example, the amount of wear of a sub-block SBLK is estimated according to a count value of the counter 25 corresponding to the sub-block SBLK. The amount of wear may be the count value itself of the counter 25. The amount of wear may be managed by the control circuit 21 as a value based on the count value of the counter 25.

Figure 11:
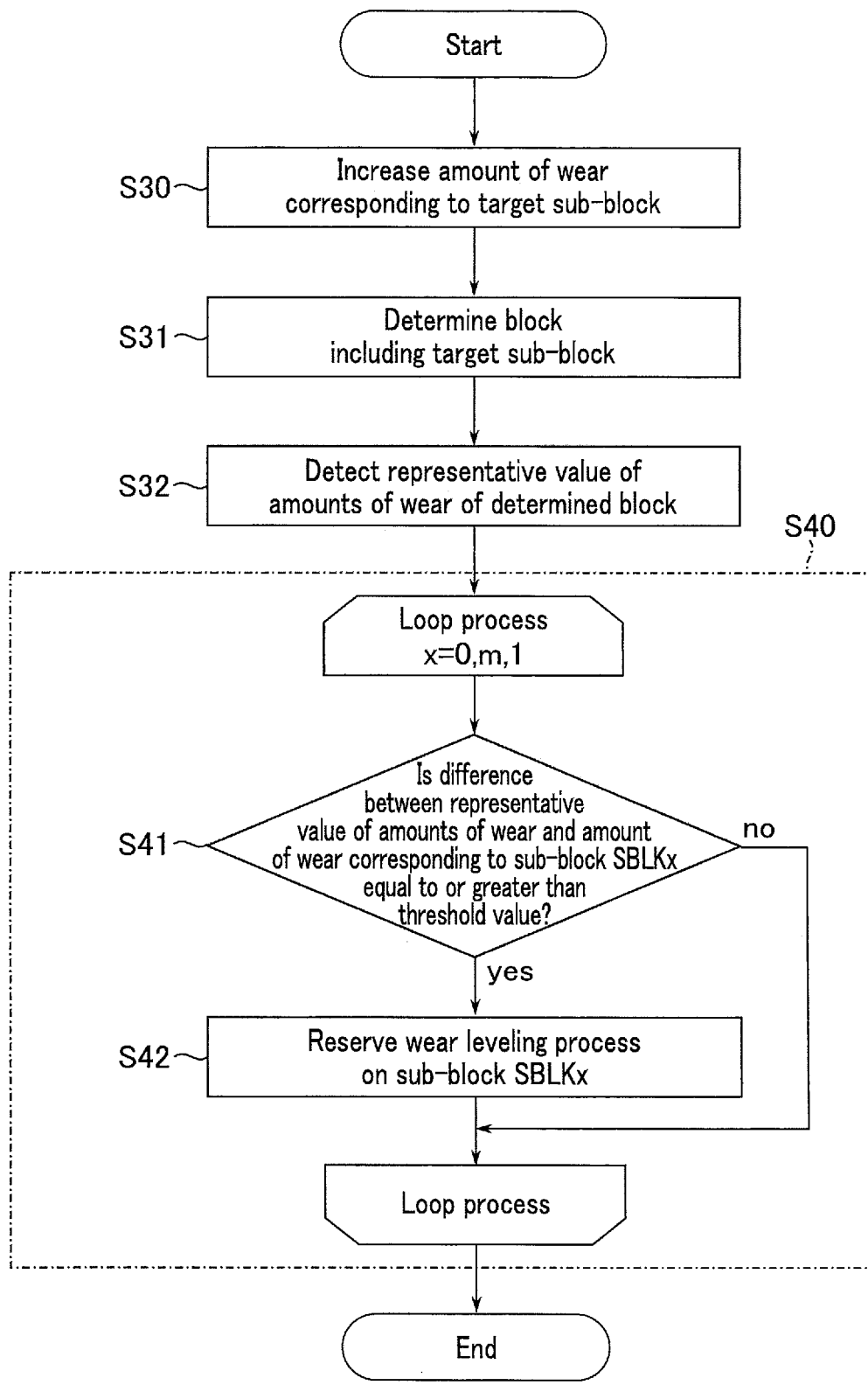
FIG. 11 is a flowchart illustrating an example of a reliability determination process based on an amount of wear in a memory system according to a second embodiment.

FIG. 11 is a flowchart illustrating an example of a reliability determination process in the memory system according to the second embodiment.

If a data erase process is executed on a target sub-block SBLK (START), the control circuit 21 increases an amount of wear corresponding to the target sub-block SBLK (S30). Specifically, if the counter 25 is an up-counter, the control circuit 21 increments the count value of the counter 25 corresponding to the target sub-block SBLK. If the counter 25 is a down-counter, the control circuit 21 decrements the count value of the counter 25 corresponding to the target sub-block SBLK.

The control circuit 21 determines a block BLK including the target sub-block (S31).

The control circuit 21 detects a representative value of the amounts of wear of the sub-blocks SBLK in the block BLK determined in the process at step S31 (S32). The representative value may be a maximum value of the amounts of wear of the sub-blocks SBLK in the block BLK determined in the process at step S31. The representative value may be an average value of the amounts of wear of the sub-blocks SBLK in the block BLK determined in the process at step S31. Note that, if the counter 25 is an up-counter, the maximum value of the amounts of wear corresponds to the maximum count value. If the counter 25 is a down-counter, the maximum value of the amounts of wear corresponds to the minimum count value.

The control circuit 21 executes a loop process based on a variable x on the block BLK determined in the process at S31 (S40). The variable x is an integer equal to or greater than 0. The loop process at step S40 is started with the variable x being 0. In the loop process at step S40, the variable x is incremented by 1 whenever a repetition unit is executed. The loop process at step S40 ends when the variable x exceeds m. The loop process at S40 includes steps S41 and S42 as the repetition unit.

The control circuit 21 determines whether or not a difference between the representative value of the amounts of wear detected in the process at step S32 and the amount of wear corresponding to a sub-block SBLKx is equal to or greater than a threshold value Th2 (S41). The threshold value Th2 is, for example, a positive real number.

If the difference between the representative value of the amounts of wear and the amount of wear corresponding to the sub-block SBLKx is determined to be equal to or greater than the threshold value Th2 (S41; yes), the control circuit 21 reserves a wear leveling process on the sub-block SBLKx (S42). The wear leveling process is, for example, a process of transcribing data written in the sub-block SBLKx onto another sub-block SBLK.

As an example of the wear leveling process, the control circuit 21 may reserve a compaction process in which data stored in the sub-block SBLKx is to be compacted. The compaction process in which the data stored in the sub-block SBLKx is to be compacted is, for example, a process of writing data written in the sub-block SBLKx into another sub-block SBLK. Said another sub-block SBLK is, for example, a sub-block SBLK in a block BLK that includes the sub-block SBLKx. Said another sub-block SBLK may be a sub-block SBLK in a block BLK different from the block BLK that includes the sub-block SBLKx.

As another example of the wear leveling process, the control circuit 21 may exchange data written in the sub-block SBLKx and data written in a sub-block SBLK with a large amount of wear. For example, the control circuit 21 may regard, as a sub-block SBLK with a large amount of wear, a sub-block SBLK with the maximum value of the amounts of wear detected in the process at step S32, or a sub-block SBLK with an amount of wear that is equal to or greater than an average value of the amounts of wear detected in the process at step S32.

After the process at step S42, or if the difference between the representative value of the amounts of wear and the amount of wear corresponding to the selected sub-block SBLKs is determined to be less than the threshold value Th2 (S41; no), the repetition unit of the loop process at step S40 ends. After incrementing the variable x, the control circuit 21 determines whether or not the variable x has exceeded m. If the variable x is equal to or less than m, the repetition unit of the loop process at step S40 is executed. If the variable x exceeds m, the loop process at step S40 ends.

After the loop process at step S40 ends, the reliability determination process ends (END).

Note that, after the reliability determination process, the memory controller 20 executes a wear leveling process at, for example, a predetermined timing. Such a wear leveling process may be executed in synchronization with or out of synchronization with the reliability determination process.

2. 2 Effects of Second Embodiment

According to the second embodiment, the control circuit 21 reserves a wear leveling process on a sub-block SBLK if a difference between the amount of wear corresponding to the selected sub-block SBLK and a representative value of the amounts of wear corresponding to the respective sub-blocks SBLK in a block BLK that includes the sub-block SBLK has reached a threshold value Th2. Thereby, the frequency of a cycle of a data write process and a data erase process executed on the sub-block SBLK can be changed through a subsequent wear leveling process. It is thereby possible to suppress deterioration in reliability of the sub-block SBLK with a large amount of wear.

That is, it can be inferred that a sub-block SBLK with a small amount of wear stores data with a long lifetime from writing to erasing. In a wear leveling process, data with such a long lifetime is transcribed from the sub-block SBLK with the small amount of wear to another sub-block SBLK. It is thereby possible to give the sub-block SBLK with the small amount of wear an opportunity to store data with a shorter lifetime. Accordingly, it can be expected that a difference in the amount of wear between a sub-block SBLK with a small amount of wear and a sub-block SBLK with a large amount of wear can be decreased. It is thereby possible to suppress deterioration in reliability of the sub-block SBLK with the large amount of wear.

The control circuit 21 increases the amount of wear corresponding to the target sub-block SBLK in accordance with a cycle of a data erase process and a data write process on the target sub-block SBLK. Thereby, the effect of the cycle of the data erase process and the data write process causing the target sub-block SBLK to wear down can be reflected in the amount of wear corresponding to the target sub-block SBLK.

3. Third Embodiment

Next, a memory system according to a third embodiment will be described. The third embodiment differs from the second embodiment in terms of suppression of deterioration in reliability caused by variation in wear among the sub-blocks SBLK included in different blocks BLK. Hereinafter, mainly differences from the second embodiment in terms of the configuration and the operation will be described. A description of configurations and operations equivalent to those of the second embodiment will be suitably omitted.

3. 1 Reliability Determination Process

If a target sub-block SBLK breaks down, the number of sub-blocks SBLK for storing write data from the host 2 in the user region 12 decreases. Thereby, the number of cycles of a data erase process and a data write process executed per sub-block SBLK may increase. It is thus desirable, from the viewpoint of suppressing deterioration in reliability of the non-volatile memory 10, that variation in wear among the sub-blocks SBLK included in different blocks BLK be small.

Figure 12:
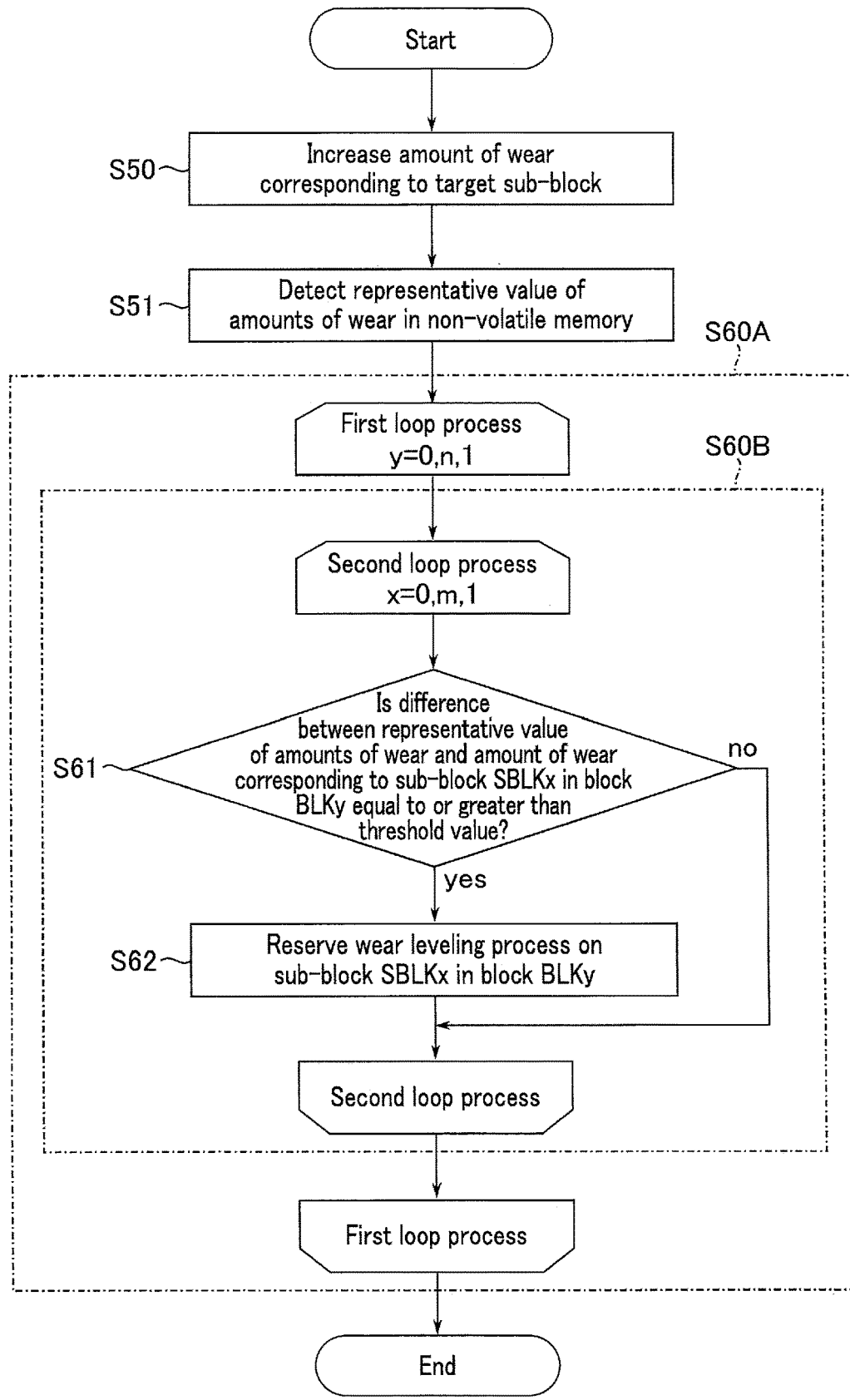
FIG. 12 is a flowchart illustrating an example of a reliability determination process based on an amount of wear in a memory system according to a third embodiment.

FIG. 12 is a flowchart illustrating an example of a reliability determination process in the memory system according to the third embodiment.

If a data erase process is executed on a target sub-block SBLK (START), the control circuit 21 increases an amount of wear corresponding to the target sub-block SBLK (S50).

The control circuit 21 detects a representative value of the amounts of wear of the sub-blocks SBLK in the non-volatile memory 10 (S51). The representative value may be the maximum value of the amounts of wear of the sub-blocks SBLK in the non-volatile memory 10. The representative value may be an average value of the amounts of wear of the sub-blocks SBLK in the non-volatile memory 10.

The control circuit 21 executes a first loop process based on a variable y on the non-volatile memory 10 (S60A). The variable y is an integer equal to or greater than 0. The first loop process at step S60A is started with the variable y being 0. In the first loop process at step S60A, the variable y is incremented by 1 whenever a first repetition unit is executed. The first loop process at step S60A ends when the variable y exceeds n. The first loop process at step S60A includes, as the first repetition unit, a second loop process (S60B) based on a variable x. The variable x is an integer equal to or greater than 0. The second loop process at step S60B is started with the variable x being 0. In the second loop process at step S60B, the variable x is incremented by 1 whenever a second repetition unit is executed. The second loop process at step S60B ends when the variable x exceeds m. The second loop process at step S60B includes steps S61 and S62 as the second repetition unit.

The control circuit 21 determines whether or not a difference between the representative value of the amounts of wear detected in the process at step S51 and the amount of wear corresponding to a sub-block SBLKx in a block BLKy is equal to or greater than a threshold value Th2 (S61).

If the difference between the representative value of the amounts of wear and the amount of wear corresponding to the sub-block SBLKx in the block BLKy is determined to be equal to or greater than the threshold value Th2 (S61; yes), the control circuit 21 reserves a wear leveling process on the sub-block SBLKx in the block BLKy (S62).

As an example of the wear leveling process, the control circuit 21 may reserve a compaction process in which data stored in the sub-block SBLKx in the block BLKy is to be compacted using another sub-block SBLK. In this case, said another sub-block SBLK in which the data to be compacted is to be stored is, for example, a sub-block SBLK in a block BLK different from the block BLKy. Said another sub-block SBLK may be a sub-block SBLK in the block BLKy.

As another example of the wear leveling process, the control circuit 21 may exchange data written in the sub-block SBLKx in the block BLKy and data written in a sub-block SBLK with a large amount of wear. For example, the control circuit 21 may regard, as the sub-block SBLK with the large amount of wear, a sub-block SBLK with the maximum value of the amounts of wear detected in the process at step S51, or a sub-block SBLK with the amount of wear that is equal to or greater than the average value of the amounts of wear detected in the process step S51.

After the process at step S62, or if the difference between the representative value of the amounts of wear and the amount of wear corresponding to the sub-block SBLKx in the block BLKy is determined to be less than the threshold value Th2 (S61; no), the second repetition unit of the second loop process at step S60B ends. After incrementing the variable x, the control circuit 21 determines whether or not the variable x has exceeded m. If the variable x is equal to or less than m, the second repetition unit of the second loop process at step S60B is repeated. If the variable x exceeds m, the second loop process at step S60B (i.e., the first repetition unit of the first loop process at step S60A) ends. After incrementing the variable y, the control circuit 21 determines whether or not the variable y has exceeded n. If the variable y is equal to or less than n, the first repetition unit of the first loop process at step S60A is executed. If the variable y exceeds n, the first loop process at step S60A ends.

After the first loop process at step S60A ends, the reliability determination process ends (END).

Note that, after the reliability determination process, the memory controller 20 executes a wear leveling process at, for example, a predetermined timing. Such a wear leveling process may be executed in synchronization with or out of synchronization with the reliability determination process.

3. 2 Effects of Third Embodiment

According to the third embodiment, the control circuit 21 reserves a wear leveling process on a sub-block SBLK in a block BLK if a difference between the amount of wear corresponding to the sub-block SBLK in the block BLK and a representative value of the amounts of wear corresponding to the respective sub-blocks SBLK in the non-volatile memory 10 has reached a threshold value Th2. Thereby, the frequency of a cycle of a data write process and a data erase process executed on the sub-block SBLK in the block BLK can be changed through a subsequent wear leveling process. It is thereby possible to suppress deterioration in reliability of a sub-block SBLK with a large amount of wear.

4. Modifications, Etc.

Various modifications may be applied to the first, second, and third embodiments.

In the first, second, and third embodiments, a case has been described where a lower part IMP and an upper part UMP of a memory pillar MP respectively correspond to sub-blocks SBLK0 and SBLK1; however, the configuration is not limited thereto. For example, the sub-blocks SBLK0 and SBLK1 may not correspond to the lower part IMP and the upper part UMP of the memory pillar MP. Specifically, a block BLK including a memory pillar MP that is not separated into a lower part LMP and an upper part UMP may be separated into sub-blocks SBLK0 and SBLK1. In the case of a memory pillar MP separated into a lower part IMP and an upper part UMP, a block BLK may be separated into sub-blocks SBLK0 and SBLK1 at a boundary different from a boundary between the lower part LMP and the upper part UMP. The sub-blocks SBLK0 and SBLK1 may correspond to, for example, portions of different memory pillars MP coupled in parallel with respect to a single bit line BL.

In the second and third embodiments, a case has been described where the amount of wear increases with the amount of increase of the count value of the counter 25; however, the configuration is not limited thereto. The amount of increase of the amount of wear may be calculated further based on temperature of the non-volatile memory 10 during execution of a cycle of a data write process and a data erase process. The amount of increase of the amount of wear, in the case of temperature of the non-volatile memory 10 during execution of a cycle of a data write process and a data erase process being high, may be smaller than the amount of increase of the amount of wear, in the case of temperature of the non-volatile memory 10 during execution of a cycle of a data write process and a data erase process being low.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A memory system comprising:
   a non-volatile memory including a first block including a plurality of memory cells, the first block including a first sub-block and a second sub-block, the first sub-block including a first memory cell, the second sub-block including a second memory cell, the second memory cell being coupled in series to the first memory cell or coupled in parallel to the first memory cell with respect to a single bit line; and a memory controller configured to instruct the non-volatile memory to execute a data erase process in units of sub-blocks on data stored in the non-volatile memory, wherein the memory controller is further configured to:

in response to a first value corresponding to the first sub-block having reached a first threshold value,
 read first data from the first sub-block;
 execute an error correction process on the first data read from the first sub-block; and
 write the first data on which the error correction process has been executed into the non-volatile memory.

2. The memory system according to claim 1, wherein the memory controller is further configured to reset the first value upon the non-volatile memory executing the data erase process on the first sub-block.

3. The memory system according to claim 1, wherein the memory controller includes an up-counter for managing the first value,
the memory controller is configured to increment a value of the up-counter upon the non-volatile memory executing the data erase process on the second sub-block.

4. The memory system according to claim 1, wherein the memory controller includes a down-counter for managing the first value, and
the memory controller is configured to decrement a value of the down-counter upon the non-volatile memory executing the data erase process on the second sub-block.

5. The memory system according to claim 1, wherein the memory controller is further configured to:
in response to a second value corresponding to the second sub-block having reached the first threshold value,
 read second data from the second sub-block;
 execute an error correction process on the second data read from the second sub-block; and
 write the second data on which the error correction process has been executed into the non-volatile memory.

6. The memory system according to claim 1, wherein the first value corresponds to a reliability of data stored in the first sub-block, and
the memory controller is further configured to:
 update the first value to a value corresponding to deterioration in the reliability of the data stored in the first sub-block upon the non-volatile memory executing the data erase process on the second sub-block.

7. The memory system according to claim 1, wherein the memory controller includes an up-counter for managing the first value, and
the memory controller is configured to increment a value of the up-counter upon a data write process being executed on the second sub-block.

8. The memory system according to claim 1, wherein the memory controller includes a down-counter for managing the first value, and
the memory controller is configured to decrement a value of the down-counter upon a data write process being executed on the second sub-block.

9. The memory system according to claim 1, wherein the non-volatile memory includes:
a first conductive layer and a second conductive layer aligned in a first direction so as to be distanced from each other; and
a memory pillar that intersects the first conductive layer and the second conductive layer in the first direction, a portion of the memory pillar that intersects the first conductive layer functioning as the first memory cell, a portion of the memory pillar that intersects the second conductive layer functioning as the second memory cell.

10. The memory system according to claim 9, wherein the memory pillar includes a first portion including the portion that intersects the first conductive layer and a second portion including the portion that intersects the second conductive layer, and
a side surface of the first portion and an extension of a side surface of the second portion are not aligned to each other in a plane including the first direction.

11. A memory system comprising:
a non-volatile memory including a plurality of blocks, the plurality of blocks including at least a first block, each of the plurality of blocks including a plurality of sub-blocks, each of the plurality of sub-blocks including a plurality of memory cells,
the first block including at least a first sub-block and a second sub-block, the first sub-block including a first memory cell, the second sub-block including a second memory cell coupled in series to the first memory cell or coupled in parallel to the first memory cell with respect to a single bit line; and
a memory controller configured to instruct the non-volatile memory to execute a data erase process in units of sub-blocks on data stored in the non-volatile memory, wherein
the memory controller is further configured to:
write data stored in the first sub-block into a third sub-block different from the first sub-block in response to a difference between a third value and a fourth value having reached a second threshold value, the third value indicating an amount of wear of the first sub-block, the fourth value indicating a maximum value of amounts of wear of the plurality of sub-blocks in the first block.

12. The memory system according to claim 11, wherein the third sub-block is a sub-block from which data has been erased.

13. The memory system according to claim 11, wherein the third sub-block is a sub-block corresponding to the fourth value, and
the memory controller is configured to exchange data stored in the first sub-block and data stored in the third sub-block between the first sub-block and the third sub-block.

14. The memory system according to claim 11, wherein the non-volatile memory includes:
a first conductive layer and a second conductive layer aligned in a first direction so as to be distanced from each other; and
a memory pillar that intersects the first conductive layer and the second conductive layer in the first direction, a portion of the memory pillar that intersects the first conductive layer functioning as the first memory cell, a portion of the memory pillar that intersects the second conductive layer functioning as the second memory cell.

15. The memory system according to claim 14, wherein the memory pillar includes a first portion including the portion that intersects the first conductive layer and a second portion including the portion that intersects the second conductive layer, and
a side surface of the first portion and an extension of a side surface of the second portion are not aligned to each other in a plane including the first direction.

16. A memory system comprising:
a non-volatile memory including a plurality of blocks, the plurality of blocks including at least a first block, each of the plurality of blocks including a plurality of sub-blocks, each of the plurality of sub-blocks including a plurality of memory cells,
the first block including at least a first sub-block and a second sub-block, the first sub-block including a first memory cell, the second sub-block including a second memory cell coupled in series to the first memory cell or coupled in parallel to the first memory cell with respect to a single bit line; and
a memory controller configured to instruct the non-volatile memory to execute a data erase process in units of sub-blocks on data stored in the non-volatile memory, wherein
the memory controller is further configured to:
write data stored in the first sub-block into a third sub-block different from the first sub-block in response to a difference between a fifth value and a sixth value having reached a third threshold value, the fifth value indicating an amount of wear of the first sub-block, the sixth value indicating a maximum value of amounts of wear of the plurality of sub-blocks in the plurality of blocks.

17. The memory system according to claim 16, wherein the third sub-block is a sub-block from which data has been erased.

18. The memory system according to claim 16, wherein the third sub-block is a sub-block corresponding to the sixth value, and
the memory controller is configured to exchange data stored in the first sub-block and data stored in the third sub-block between the first sub-block and the third sub-block.

19. The memory system according to claim 16, wherein the non-volatile memory includes:
a first conductive layer and a second conductive layer aligned in a first direction so as to be distanced from each other; and
a memory pillar that intersects the first conductive layer and the second conductive layer in the first direction, a portion of the memory pillar that intersects the first conductive layer functioning as the first memory cell, and a portion of the memory pillar that intersects the second conductive layer functioning as the second memory cell.

20. The memory system according to claim 19, wherein the memory pillar includes a first portion including the portion that intersects the first conductive layer and a second portion including the portion that intersects the second conductive layer, and
a side surface of the first portion and an extension of a side surface of the second portion are not aligned to each other in a plane including the first direction.

* * * * *